(12) United States Patent
Purden et al.

(10) Patent No.: US 10,199,707 B2
(45) Date of Patent: Feb. 5, 2019

(54) BALL-GRID-ARRAY RADIO-FREQUENCY INTEGRATED-CIRCUIT PRINTED-CIRCUIT-BOARD ASSEMBLY FOR AUTOMATED VEHICLES

(71) Applicant: Aptiv Technologies Limited, St. Michael (BB)

(72) Inventors: George J. Purden, Westlake Village, CA (US); Shawn Shi, Thousand Oaks, CA (US); David W. Zimmerman, Noblesville, IN (US)

(73) Assignee: APTIV TECHNOLOGIES LIMITED (BB)

( * ) Notice: Subject to any disclaimer, the term of this patent is extended or adjusted under 35 U.S.C. 154(b) by 0 days.

(21) Appl. No.: 15/292,824

(22) Filed: Oct. 13, 2016

(65) Prior Publication Data

US 2018/0108968 A1 Apr. 19, 2018

(51) Int. Cl.
*H01P 5/08* (2006.01)
*H01L 23/498* (2006.01)
(Continued)

(52) U.S. Cl.
CPC .......... *H01P 5/08* (2013.01); *H01L 23/49827* (2013.01); *H01L 23/49838* (2013.01);
(Continued)

(58) Field of Classification Search
CPC .................. H01P 3/10; H01L 23/49827; H01L 23/49838; H01L 23/66; H01L 24/16;
(Continued)

(56) References Cited

U.S. PATENT DOCUMENTS 9,537,199 B2 * 1/2017 Dang ........................ H01P 5/02
2016/0111764 A1 4/2016 Kim
(Continued)

FOREIGN PATENT DOCUMENTS

CN 203826522 U * 9/2014
EP 2 337 147 A1 6/2011
(Continued)

OTHER PUBLICATIONS

Kolding, "Improving Accuracy and Reliability of Microwave On-wafer Silicon Device Measurements", Microwave Journal, Nov. 2000, pp. 1-13.*

(Continued)

*Primary Examiner* — Benny Lee
*Assistant Examiner* — Hafizur Rahman
(74) *Attorney, Agent, or Firm* — Lawrence O. Hazelton

(57) ABSTRACT

A ball-grid-array printed-circuit-board assembly includes a die, a plurality of solder-balls, a substrate, a top-metal layer, and a bottom-metal layer. The die includes a signal-out-pad and a plurality of ground-pads arranged about the signal-out-pad. The top-metal layer, a plurality of vias in the substrate, and the bottom-metal layer cooperate to form a substrate-integrated-waveguide. The top-metal layer is configured to define a U-shaped-slot between a signal-portion of the top-metal layer aligned with the signal-out-pad and the substrate-integrated-waveguide, and a ground-portion of the top-metal layer aligned with the plurality of ground-pads. The U-shaped-slot is characterized by a slot-length that is selected based on the frequency of a signal, and a slot-width that is selected based on the via-height such that the signal generates an electric field directed across the U-shaped-slot whereby the signal is propagated from the signal-portion of the top-metal layer into the substrate-integrated-waveguide.

3 Claims, 2 Drawing Sheets

(51) Int. Cl.
  *H01L 23/66* (2006.01)
  *H01L 23/00* (2006.01)
  *H01P 3/10* (2006.01)
  *H05K 1/02* (2006.01)
  *H05K 1/11* (2006.01)
  *H01P 3/12* (2006.01)
  *H01P 5/107* (2006.01)

(52) U.S. Cl.
  CPC .............. *H01L 23/66* (2013.01); *H01L 24/16* (2013.01); *H01P 3/10* (2013.01); *H01P 3/121* (2013.01); *H01P 5/107* (2013.01); *H05K 1/0219* (2013.01); *H05K 1/111* (2013.01); *H05K 1/115* (2013.01); *H01L 2223/6616* (2013.01); *H01L 2223/6627* (2013.01); *H01L 2224/16227* (2013.01)

(58) Field of Classification Search
  CPC ..... H01L 2223/6616; H01L 2223/6627; H01L 2224/16227; H05K 1/0219; H05K 1/111; H05K 1/115
  USPC ........................................................ 333/239
  See application file for complete search history.

(56) References Cited

U.S. PATENT DOCUMENTS

2016/0276727 A1\* 9/2016 Dang ..................... H01P 5/02
2017/0346170 A1\* 11/2017 Shi ....................... H01Q 1/3233

FOREIGN PATENT DOCUMENTS

GB        2 499 792 A      9/2013
JP        3 852598 B2      11/2006

OTHER PUBLICATIONS

Cheng, "Substrate Integrated Antennas and Arrays", CRC Press, ISBN: 13-978-1-4987-1453-2, 2016 by Taylor & Francis Group, pp. 159.\*

\* cited by examiner

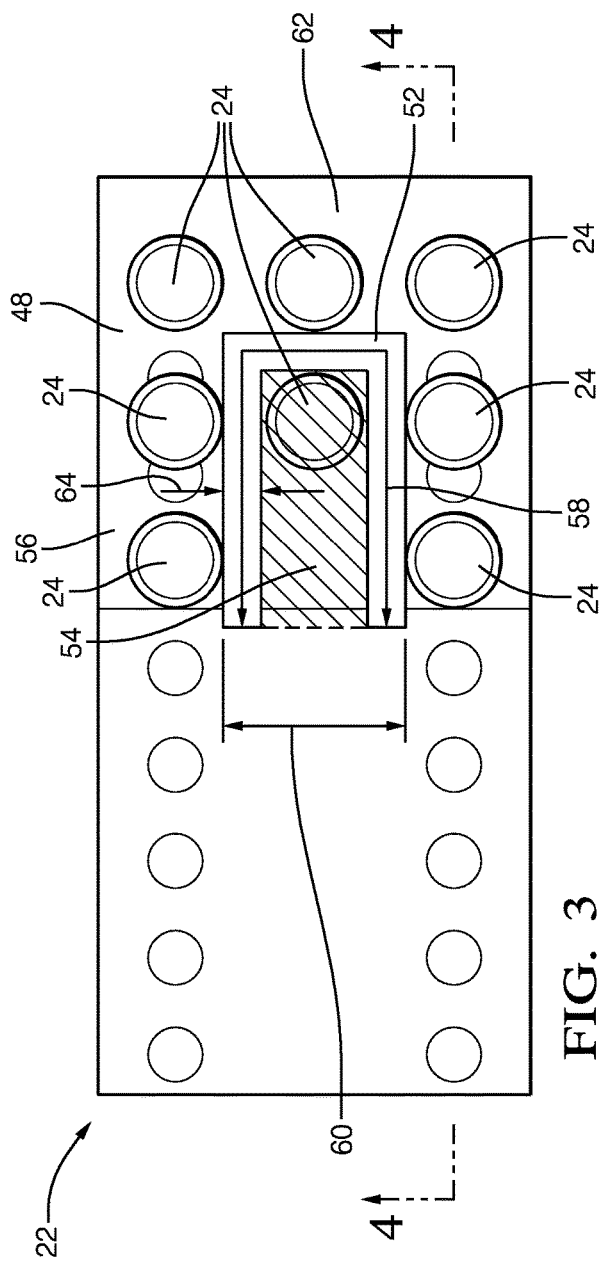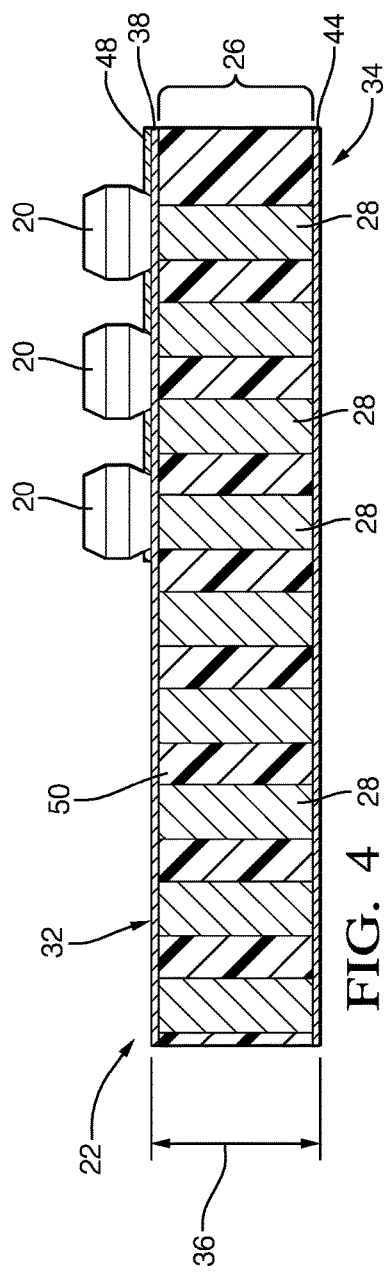

BALL-GRID-ARRAY RADIO-FREQUENCY INTEGRATED-CIRCUIT PRINTED-CIRCUIT-BOARD ASSEMBLY FOR AUTOMATED VEHICLES

TECHNICAL FIELD OF INVENTION

This disclosure generally relates to a BGA circuit assembly, and more particularly relates to using a U-shaped-slot in a top-metal layer to generate an electric field directed across the U-shaped-slot whereby a signal is propagated from the U-shaped-slot directly into the substrate-integrated-waveguide (SIW).

BACKGROUND OF INVENTION

It is known to equip automated vehicles with a wide variety of sensing systems. Various sensor configurations have been developed to provide assistance or information to a driver or autonomous controller regarding the environment surrounding the vehicle. Advances in radio frequency signaling technology have enabled the development of sophisticated system-on-a-chip integrated circuits. The functionality required for environmental sensing or communications can be embodied in integrated circuit components. Example uses for such devices include automotive vehicle radar detection systems, robotics guiding systems, and Wi-Fi data transfer.

Antennas for radio-frequency (RF) signal transmission vary depending on the particular sensing or communication of interest. For example, relatively small, low-gain, broad-band antennas are used for Wi-Fi communications, and relatively large, high-gain antennas are typically used for point-to-point data communications. Antennas useful for automotive radar systems typically fall between those two extremes. One type of antenna component that can be useful for propagating RF signals in a vehicle-based radar system is known as a substrate-integrated-waveguide (SIW). The SIW is desirable because of high-efficiency and are relatively low-cost.

One challenge associated with utilizing SIWs in a vehicle-based sensing or communication system is associated with the connection between an integrated circuit and the SIW. For example, microstrip or coplanar waveguide microwave transmission lines can provide an interface between the integrated circuit and the SIW. However, such connections include drawbacks, such as the requirement for a microwave component that matches the field configuration peculiar to each transmission line. The transition associated with such a microwave component increases microwave loss and introduces microwave reflections that may limit bandwidth and impact the ability to produce such systems. When a microstrip is used, bandwidth may be limited by the requirement for the ground connection to pass from the integrated circuit component connectors through the SIW substrate to a metal layer on that substrate. Furthermore, such connections are typically made using a relatively expensive blind via process.

SUMMARY OF THE INVENTION

Described herein is a high-frequency circuit-board-assembly that includes a means to form a direct connection of ball-grid-array attached radio-frequency integrated-circuit output to substrate-integrated-waveguide (SIW) formed by features on a printed-circuit-board (PCB). The assembly overcomes the problems described above by eliminating various interconnecting transitions such as microstrips, which maximizes performance while minimizing complexity. The direct connection allows for radio-frequency (RF) energy from the integrated circuit to be radiated directly into a SIW by or through a U-shaped-slot etched in the top-metal layer of the PCB. The resonant frequency of the U-shaped-slot is determined or influenced by a slot-length of the U, where the length is the totality of the perimeter of the U. That is, when viewing the U on this page, the length is the sum of twice the distance measured in an up-down direction plus one of the distance measured in a left-right direction of the U. The efficiency of coupling of RF energy from the U-shaped-slot is determined or influenced by a shape-width corresponding to the width of the base of the U-shaped-slot. That is, the shape-width is measured in a left-right direction across the U on this page. Some of the vias used to form the SIW are also used to form a back-short that helps to direct or reflect RF energy toward a desired direction of propagation of the SIW.

In accordance with one embodiment, a ball-grid-array attached radio-frequency integrated-circuit printed-circuit-board assembly is provided. The assembly includes a die, a plurality of solder-balls, a substrate, a top-metal layer, and a bottom-metal layer. The die includes a signal-out-pad and a plurality of ground-pads arranged about the signal-out-pad. The die is operable to output a signal via the signal-out-pad. The signal characterized by a frequency. The plurality of solder-balls is used to attach the die. The substrate defines a plane and includes a plurality of vias oriented normal to the plane and extending from a top-side of the substrate to a bottom-side of the substrate. The plurality of vias is characterized by a via-height that corresponds to a thickness of the substrate. The top-metal layer is attached to the top-side of the substrate. The top-metal layer is configured to provide solder-pads for the plurality of solder-balls to attach the die to the top-metal layer. The bottom-metal layer is attached to the bottom-side of the substrate. The top-metal layer, the plurality of vias in the substrate, and the bottom-metal layer cooperate to form a substrate-integrated-waveguide suitable to propagate the signal in a direction parallel to the plane of the substrate. The top-metal layer is configured to define a U-shaped-slot between a signal-portion of the top-metal layer aligned with the signal-out-pad and the substrate-integrated-waveguide, and a ground-portion of the top-metal layer aligned with the plurality of ground-pads. The U-shaped-slot is characterized by a slot-length that is selected based on the frequency of the signal, and a slot-width that is selected based on the via-height such that the signal generates an electric field directed across the U-shaped-slot whereby the signal is propagated from the signal-portion of the top-metal layer into the substrate-integrated-waveguide.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 3 is a top view of a printed-circuit-board used in circuit assembly of FIG. 2 in accordance with one embodiment; and FIG. 4 is a side view of a partial assembly of the circuit assembly of FIG. 2 in accordance with one embodiment.

DETAILED DESCRIPTION

Embodiments of this invention provide a signaling device with an improved connection between a ball-grid-array attached integrated-circuit die and a substrate-integrated-waveguide (SIW). Embodiments of this invention advantageously eliminate interconnecting transitions between the die the SIW, which maximizes system performance while minimizing complexity.

Figure 1:
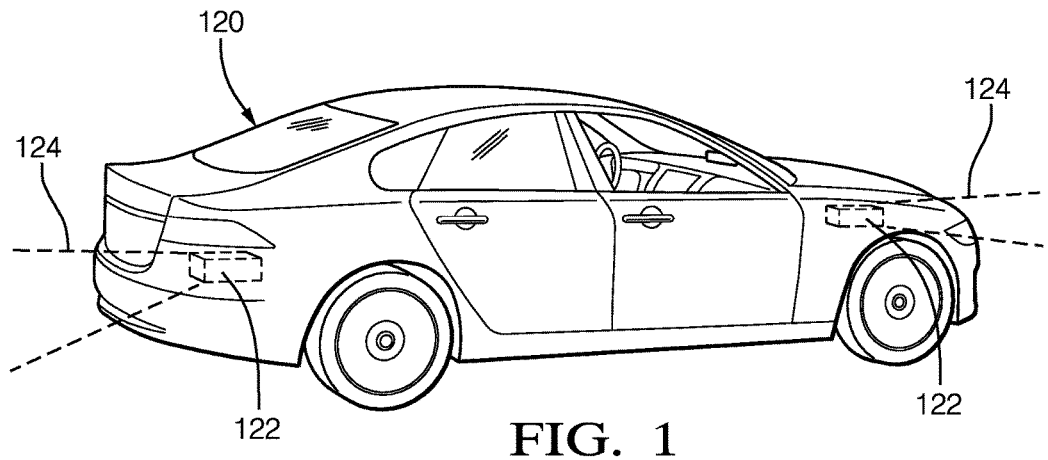
FIG. 1 is an automated vehicle equipped with a sensing-device in accordance with one embodiment.

FIG. 1 illustrates a non-limiting example of an automated vehicle 120 equipped with a plurality of signaling-devices 122. As used herein, the term automated vehicle covers a wide range of degrees or levels of automation including instances when the automated vehicle 120 is being operated in an fully-automated or autonomous mode, where a human-operator (not shown) of the automated vehicle 120 may do little more than designate a destination in order to operate the automated vehicle 120. It is also contemplated that the teachings presented herein are useful when the automated vehicle 120 is operated in a manual-mode where the degree or level of automation may be little more than activating a warning indicator (visible and/or audible) to assist the human-operator as needed to change lanes and/or avoid interference with and/or a collision with, for example, another vehicle.

By way of example, the signaling-devices 122 may be configured as radar-sensors useful for detecting objects in a vicinity of the automated vehicle 120 based on radar-signals 124 transmitted by the signaling-devices 122. Such signaling-devices 122 may also be useful for parking assistance, collision avoidance, and other object detection functions.

Figure 2:
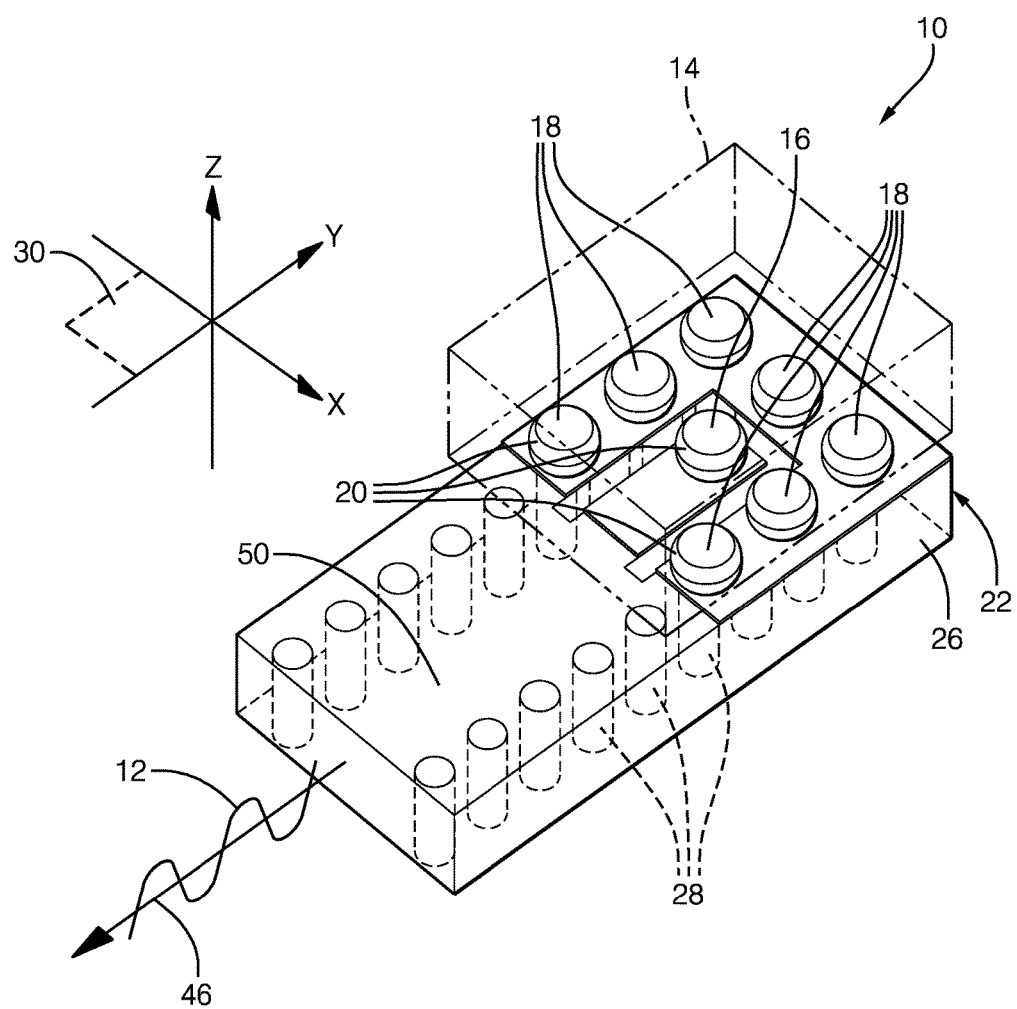
FIG. 2 is an isometric view of a circuit assembly used in the sensing-device of FIG. 1 in accordance with one embodiment.

FIG. 2 illustrates a non-limiting example of a ball-grid-array attached radio-frequency integrated-circuit printed-circuit-board assembly 10, hereafter the assembly 10, which may be part of one or more instances of the signaling-devices 122. In general, the assembly 10 is configured to propagate a radio-frequency signal, hereafter the signal 12, from a die 14 (i.e. integrated circuit) toward an antenna (not shown). The design of the assembly 10 provides for sufficient reliability such that the assembly 10 will be suitable for use on the automated vehicle 120.

The die 14 includes a signal-out-pad 16 and a plurality of ground-pads 18 arranged about the signal-out-pad 16. While this non-limiting example has all of the pads except the signal-out-pad 16 identified as ground-pads, those in the art will recognize that there will be additional pads for other signals and power. Indeed, there may be several hundred pads and corresponding solder-balls on a complex ball-grid-array (BGA) attached integrated circuit. Only a small section germane to, for example, microwave operation, a limited number of pads and solder-balls are shown only in order to simplify the drawings. The die 14 is generally operable to output a signal via the signal-out-pad 16, where the signal may be characterized by a frequency, for example seventy-seven Giga-Hertz (77 GHz) for example if the signaling-devices 122 are radar-sensors.

The assembly 10 includes a plurality of solder-balls 20 used to attach the die to a printed-circuit-board 22, hereafter the PCB 22. A variety of formulations of commercially available solder-balls are known to those skilled in the art. Typically, the solder-balls are attached to the die 14 prior to aligning and placing the die 14 with solder-balls onto corresponding instances of solder-pads 24 (FIG. 3) on the PCB 22, and then the assembly 10 is heated sufficiently to melt or reflow the plurality of solder-balls 20 and thereby solder the die 14 to the PCB 22.

The PCB 22 includes a substrate 26 that defines a plane 30 parallel to the x-axis and the y-axis illustrated in FIG. 2. The substrate 26 is formed from any of many suitable, commercially available materials, as will be recognized by those in the art. The substrate 26 includes a plurality of vias 28 oriented normal to the plane 30 (i.e. parallel to the z-axis) and extending from a top-side 32 (FIG. 4) of the substrate 26 to a bottom-side 34 of the substrate 26. The plurality of vias 28 are characterized by a via-height 36 that corresponds to (i.e. is equal to or is essentially equal to) the thickness of the substrate 26. Each of the plurality of vias 28 is preferably a conductive element comparable to a plated-through-hole or plated-via, which are known to those in the PCB arts. The plurality of vias 28 may be filled with conductive or non-conductive material, if desired.

FIGS. 3 and 4 show additional non-limiting details of the PCB 22 which includes a top-metal layer 38 attached to the top-side 32 of the substrate 26. The top-metal layer 38 in cooperation with a solder-mask 48 that overlies part of the top-metal layer 38 is configured to provide solder-pads 24 for the plurality of solder-balls 20 to attach the die 14 to the top-metal layer 38. The PCB 22 also includes a bottom-metal 44 layer attached to the bottom-side 34 of the substrate 26. A suitable example of laminate/prepreg that can be purchased with the top-metal layer 38 and the bottom-metal layer 44 already attached to the substrate 26 is model IT-150DA from ITEQ® with a thickness of 0.5 mm, a dielectric constant (Dk) of 3.5, and a lost-tangent (tan d) of 0.005.

The plurality of vias 28 may be drilled through the purchase laminate and then a subsequent plating process can be used to plate each of the plurality of vias 28 and thereby electrically connect (direct-current wise) the top-metal layer 38 to the bottom-metal layer 44. As will be recognized by those in the art, the top-metal layer 38, the plurality of vias 28 through the substrate 26, and the bottom-metal layer 44 then cooperate to form a substrate-integrated-waveguide 50, hereafter referred to as the SIW 50, suitable to propagate the signal 12 in a direction 46 parallel to the plane 30 of the substrate 26. If the signal 12 has a frequency of 77 GHz, suitable dimensions for the plurality of vias 28 include a via-diameter of 0.25 mm and a via-spacing or via-pitch of 0.45 mm.

In order to constrain the solder of the solder-balls 20 during reflow, and help align the die 14 to the PCB 22, the PCB 22 may advantageously include a solder-mask 48 overlaying at least the portion of the top-metal layer 38 underneath the die 14. That is, the solder-mask 48 may be used to define the locations of the solder-pads 24 on top of a contiguous or continuous region of the top-metal layer 38. While the solder-mask 48 is shown as only extending to the boundaries of the die 14, this is not a requirement. The solder-mask 48 could be extended to cover the entirety of the top-metal layer 38 with little effect on performance. Solder-mask could also be applied over the bottom metal layer if desired which could provide some environmental protection to the metal forming the bottom-metal layer 44, and potentially reduce self-bending of the PCB 22 during temperature cycling if the top-metal layer 38 is also entirely covered by the solder-mask 48.

In order to couple the signal 12 from the signal-out pad 16 of the die 14 directly into the SIW 50, the top-metal layer 38 is configured to define a U-shaped-slot 52 between a signal-portion 54 of the top-metal layer 38 aligned with the signal-out-pad 16 and the SIW 50, and a ground-portion 56 of the top-metal layer 38 aligned with the plurality of ground-pads 18. The U-shaped-slot 52 may be formed in the top-metal layer 38 using well-known photo-etching processes. The U-shaped-slot 52 is provided so a voltage at the signal-out-pad 16 that is fluctuating relative to the plurality of ground-pads 18 will cause an alternating electric field to form across the U-shaped-slot 52 and thereby project or emit RF energy into the SIW 50. The U-shaped-slot 52 characterized by a slot-length 58 that is selected based on the frequency of the signal 12, 3.2 mm for example for 77 GHz and a shape-width 60. The U-shaped-slot 52 is also characterized by a slot-width 64 that is selected, at least in part, based on the via-height 36. The shape-width 60 influences how well or how efficiently energy from the electric field directed across the U-shaped-slot 52 is propagated from the signal-portion 54 of the top-metal layer 38 into the substrate-integrated-waveguide, i.e. the SIW 50. It is recognized that it is preferable to make the slot-width 64 as small as possible, but the minimum dimension is determined by the capability of the photo-etching process. It is also recognized that the greater the value of a ratio defined by the via-height 36 divided by the slot-width 64, the better the coupling of RF energy into the SIW 50. By way of example and not limitation, a relatively inexpensive photo-etching process is expected to provide a reliable and well-defined instance of the U-shaped-slot 52 if the slot-width 64 is 0.1 mm. It is also believed that the minimum value of the above defined ratio should be greater than three (3), so a minimum recommended value of the via-height 36 is 0.3 mm. Since substrates with thickness of 0.5 mm are readily available and reasonably durable, 0.5 mm is the suggested value for the via-height 36.

By way of further explanation and not limitation, the signal-portion 54 and the ground-portion 56 are considered to cooperate to form a planar-waveguide that transfers the signal 12 from the die 14 directly into the substrate-integrated-waveguide (the SIW 50). As used herein the use of 'directly' means that no intermediate microwave components are present in the signal path between the solder-ball attached to the signal-portion 54 and the SIW 50.

The plurality of ground-pads 18 is arranged about the signal-out-pad 16 is arranged such that solder-balls 20 attached to the plurality of ground-pads 18 form a shield 62 used to reduce leakage of the signal 12 radiated from a solder-ball 20 attached to the signal-out-pad 16. The U-shape of the shield 62 in this example is selected because of the close proximity of the signal-out-pad 16 to the edge of the die 14. If the die 14 were illustrated to be substantially larger with many more solder-pads and solder-balls, it is contemplated that the ground-pads and associated solder-balls could be arranged into multiple concentric rings if leakage were a particular problem.

Accordingly, a ball-grid-array attached radio-frequency integrated-circuit printed-circuit-board assembly (the assembly 10) is provided. The design configuration described herein was validated by measurement. Innovative features include: direct connection of signal-out pad 16 to SIW 50; transitions from the die 14 to an intermediate component such as a microstrip and from the intermediate component to SIW 50 are eliminated; the radiating structure of the U-shaped-slot 52 is implemented using standard planar printed circuit board technology; no external components or special processes are required; and compensation for die output impedance or circuit discontinuities (matching) is provided by adjusting U-shaped-slot size and position.

While this invention has been described in terms of the preferred embodiments thereof, it is not intended to be so limited, but rather only to the extent set forth in the claims that follow.

We claim:

1. A ball-grid-array attached radio-frequency integrated-circuit printed-circuit-board assembly configured to propagate a radio-frequency signal and suitable for use in an automated vehicle, said assembly comprising:
   a die that includes a signal-out-pad and a plurality of ground-pads arranged about the signal-out-pad, said die operable to output a signal via the signal-out-pad, said signal characterized by a frequency;
   a plurality of solder-balls used to attach the die;
   a substrate that defines a plane and includes a plurality of vias oriented normal to the plane and extending from a top-side of the substrate to a bottom-side of the substrate, wherein the plurality of vias are characterized by a via-height that corresponds to a thickness of the substrate;
   a top-metal layer attached to the top-side of the substrate, said top-metal layer configured to provide solder-pads for the plurality of solder-balls to attach the die to the top-metal layer; and
   a bottom-metal layer attached to the bottom-side of the substrate, wherein the top-metal layer, the plurality of vias through the substrate, and the bottom-metal layer cooperate to form a substrate-integrated-waveguide suitable to propagate the signal in a direction parallel to the plane of the substrate, wherein the top-metal layer is configured to define a U-shaped-slot between a signal-portion of the top-metal layer that is surrounded by the U-shaped slot, said signal-portion is aligned with and connected to the signal-out-pad by one of the plurality of solder-balls, said signal-portion is aligned with the substrate-integrated-waveguide, and define a ground-portion of the top-metal layer outside of the U-shaped slot that is aligned with the plurality of ground-pads, said U-shaped-slot characterized by a slot-length that is selected based on the frequency of the signal, and a slot-width that is selected based on the via-height such that the signal generates an electric field directed across the U-shaped-slot whereby the signal is propagated from the signal-portion of the top-metal layer into the substrate-integrated-waveguide, wherein a ratio defined by the via-height divided by the slot-width is greater than three (3).

2. The assembly in accordance with claim 1, wherein the signal-portion and the ground-portion cooperate to form a planar-waveguide that transfers the signal from the die directly into the substrate-integrated-waveguide.

3. The assembly in accordance with claim 1, wherein the plurality of ground-pads is arranged about the signal-out-pad.

* * * * *